(12) United States Patent
Kim et al.

(10) Patent No.: US 9,703,186 B2
(45) Date of Patent: Jul. 11, 2017

(54) MASK INCLUDING PELLICLE, PELLICLE REPAIRING APPARATUS, AND SUBSTRATE MANUFACTURING EQUIPMENT

(71) Applicant: Samsung Electronics Co., Ltd., Suwon-si, Gyeonggi-do (KR)

(72) Inventors: Mun Ja Kim, Suwon-si (KR); Byunggook Kim, Seoul (KR); Jongju Park, Hwaseong-si (KR); Jaehyuck Choi, Seoul (KR)

(73) Assignee: Samsung Electronics Co., Ltd. (KR)

( * ) Notice: Subject to any disclaimer, the term of this patent is extended or adjusted under 35 U.S.C. 154(b) by 77 days.

(21) Appl. No.: 14/755,693

(22) Filed: Jun. 30, 2015

(65) Prior Publication Data

US 2016/0139501 A1    May 19, 2016

(30) Foreign Application Priority Data

Nov. 14, 2014 (KR) .................. 10-2014-0158824

(51) Int. Cl.
G03F 1/62 (2012.01)
G03F 1/64 (2012.01)

(52) U.S. Cl.
CPC ..................................... *G03F 1/62* (2013.01)

(58) Field of Classification Search
None
See application file for complete search history.

(56) References Cited

U.S. PATENT DOCUMENTS

| | | |
|---|---|---|
| 7,276,385 B1 | 10/2007 | MacKenzie et al. |
| 8,535,545 B2 | 9/2013 | Kim |
| 8,536,546 B2 | 9/2013 | Nguyen et al. |
| 8,585,391 B2 | 11/2013 | Kim et al. |
| 8,703,364 B2 | 4/2014 | Hsieh et al. |
| 8,741,067 B2 | 6/2014 | LeClaire et al. |
| 2003/0192567 A1 | 10/2003 | Koizumi et al. |
| 2006/0001847 A1* | 1/2006 | De Jager ............. G03F 7/70275 355/30 |
| 2012/0086929 A1 | 4/2012 | Lammers et al. |
| 2013/0089954 A1 | 4/2013 | Ro et al. |

FOREIGN PATENT DOCUMENTS

| | | |
|---|---|---|
| JP | H07199449 A | 8/1995 |
| JP | H08292554 A | 11/1996 |
| JP | 3149830 | 1/2001 |
| JP | 2010045283 A | 2/2010 |
| JP | 2010186167 A | 8/2010 |
| JP | 2011141361 A | 7/2011 |
| KR | 1020050070436 A | 7/2005 |
| KR | 100935763 B1 | 12/2009 |
| WO | WO 2011/160861 A1 | 12/2011 |

OTHER PUBLICATIONS

Barreiro et al., "Graphene at High Bias: Cracking, Layer by Layer Sublimation, and Fusing," Nano Lett., 2012, vol. 12, pp. 1873-1878.
Holloszy et al., "Peeling and sharpending multiwall nanotubes," Nature, vol. 406, Aug. 10, 2000, pp. 586.

* cited by examiner

*Primary Examiner* — Stephen Rosasco
(74) *Attorney, Agent, or Firm* — Myers Bigel, P.A.

(57) ABSTRACT

Provided is a mask. The mask may include a mask substrate, mask patterns on the mask substrate, frames disposed on an edge of the mask substrate outside the mask patterns, and a pellicle spaced apart from the mask patterns, the pellicle being disposed on the frames, wherein the pellicle includes protection layers each of which has a nanometer thickness.

13 Claims, 14 Drawing Sheets

MASK INCLUDING PELLICLE, PELLICLE REPAIRING APPARATUS, AND SUBSTRATE MANUFACTURING EQUIPMENT

CROSS-REFERENCE TO RELATED APPLICATION

This U.S. non-provisional patent application claims priority under 35 U.S.C. §119 of Korean Patent Application No. 10-2014-0158824, filed Nov. 14, 2014, the entire contents of which are hereby incorporated herein by reference.

FIELD

The present disclosure herein relates to substrate manufacturing equipment, and more particularly, to a mask including a pellicle, a pellicle repairing apparatus, and substrate manufacturing equipment.

BACKGROUND

As information technology is developed, researches on high integrated semiconductor devices are being actively performed. The integration degree of semiconductor devices may be almost determined by a wavelength of light in a lithography process. The light may include excimer laser light such as I-line, G-line, KrF, and ArF and EUV light that has a wavelength shorter than that of the excimer laser light. Among these, EUV light has energy significantly greater than that of excimer laser light. EUV light may cause pellicle contamination of a mask. The contaminated pellicle is mostly replaced for use. This may act as a factor causing reduction in productivity.

SUMMARY

The present disclosure provides a mask including a pellicle with a nanometer thickness.

The present disclosure also provides a pellicle repairing apparatus for repairing a contaminated pellicle and substrate manufacturing equipment including the same.

Embodiments of the inventive concept provide masks including a mask substrate; mask patterns on the mask substrate; frames disposed on an edge of the mask substrate outside the mask patterns; and a pellicle spaced apart from the mask patterns, the pellicle being disposed on the frames, wherein the pellicle includes protection layers each of which has a nanometer thickness.

In some embodiments, each of the protection layers may include graphite. The pellicle may further include a plurality of support layers supporting the protection layers and alternately disposed with the protection layers. Each of the support layers may include graphene. Each of the support layers may include a carbon nano-tube.

In other embodiments of the inventive concept, pellicle repairing apparatus include a chamber; a chuck disposed in the chamber, the chuck supporting a photo-mask provided with a pellicle comprising protection layers each of which has a nanometer thickness; a detector detecting a contaminant on the pellicle; and a decontamination part fusing at least one of the contaminant and the protection layers.

In still other embodiments of the inventive concept, substrate manufacturing equipment includes a spinner apparatus applying and developing photoresist on a substrate; an exposure apparatus transferring a mask pattern of a mask onto the photoresist; and a pellicle repairing apparatus repairing a pellicle of the mask, wherein the pellicle repairing apparatus includes: a chamber; a chuck disposed in the chamber, the chuck supporting a photo-mask provided with a pellicle comprising protection layers each of which has a nanometer thickness; a detector detecting a contaminant on the pellicle; and a decontamination part fusing at least one of the contaminant and the protection layers.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION OF THE EMBODIMENTS

Figure 1:
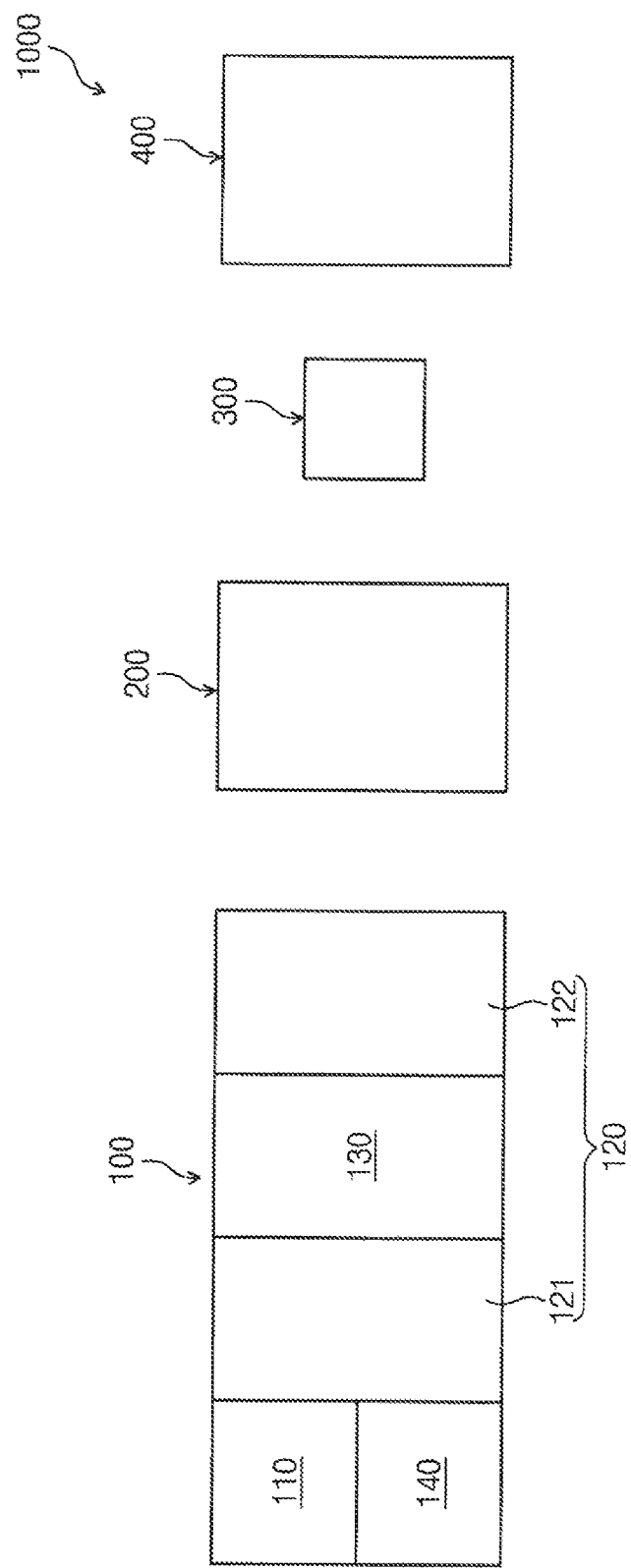
FIG. 1 is a view of substrate manufacturing equipment according to the inventive concept.

Hereinafter, exemplary embodiments will be described in detail with reference to the accompanying drawings. Advantages and features of the present invention, and implementation methods thereof will be clarified through the following embodiments described with reference to the accompanying drawings. The invention may, however, be embodied in many different forms and should not be construed as being limited to the embodiments set forth herein. Rather, these embodiments are provided so that this disclosure will be thorough and complete, and will fully convey the scope of the present invention to those skilled in the art. Further, the present invention is only defined by scopes of claims. Like reference numerals refer to like elements throughout.

In the following description, the technical terms are used only for explaining a specific exemplary embodiment while not limiting the present invention. The terms of a singular form may include plural forms unless referred to the contrary. The meaning of "include," "comprise," "including," or "comprising," specifies a property, a region, a fixed number, a step, a process, an element and/or a component but does not exclude other properties, regions, fixed numbers, steps, processes, elements and/or components. Since preferred embodiments are provided below, the order of the reference numerals given in the description is not limited thereto.

A semiconductor device may be manufactured through a plurality of unit processes. Each of the unit processes may include a lithography process, a thin film formation process, an etching process, an ion implantation process and/or a sub unit process of a cleaning process. Among them, the lithography process is a process of forming a mask layer on a substrate. The substrate may be a wafer. The mask layer may be a photoresist pattern. The lithography process may include a photoresist coating process, a bake process, an exposure process, a post-exposure bake process, and a developing process.

The photoresist coating process is a process of coating a photoresist on a substrate. The bake process and the post-exposure bake process are processes of curing the coated photoresist. The exposure process is a process of transferring a mask pattern of a mask to the photoresist using light. The developing process is a process of developing the exposed photoresist to form a photoresist pattern corresponding to the mask pattern. The mask pattern may be formed on a mask substrate and protected by a pellicle. According to an embodiment of the inventive concept, the pellicle may be repairable.

FIG. 1 illustrates substrate manufacturing equipment 1000 according to the inventive concept. The substrate manufacturing equipment 1000 according to the inventive concept may be lithography equipment. The substrate manufacturing equipment 1000 may form a photoresist pattern on a substrate. According to an example, the substrate manufacturing equipment 1000 may include a spinner apparatus 100, an exposure apparatus 200, a mask transfer device 300, and a pellicle repairing apparatus 400.

The spinner apparatus 100 may perform a photoresist coating process, a bake process, a post-exposure bake process, and a developing process. According to an example, the spinner apparatus 100 may include a spin coater 110, substrate transfer units 120, a baker 130, and a developer 140. The spin coater 110 may apply a photoresist on a substrate. The substrate transfer units 120 may transfer the substrate within the spinner apparatus 100. The substrate transfer units 120 may include a first substrate transfer unit 121 and a second substrate transfer unit 122. The first substrate transfer unit 121 may transfer the substrate between the spin coater 110 and the baker 130 and/or between the developer 140 and the baker 130. The baker 130 may perform the bake process and the post-exposure bake process. The photoresist may be cured within the baker 130. The second substrate transfer unit 122 may transfer the substrate between the baker 130 and the exposure apparatus 200.

The exposure apparatus 200 may perform the exposure process. According to an example, the exposure apparatus 200 may include an EUV exposer. The mask transfer device 300 may be disposed between the exposure apparatus 200 and the pellicle repairing apparatus 400. The mask transfer device 300 may transfer a mask between the exposure apparatus 200 and the pellicle repairing apparatus 400. The pellicle repairing apparatus 400 may repair a contaminated pellicle. The repaired pellicle may be retransferred to the exposure apparatus 200 by the mask transfer device 300.

Figure 2:
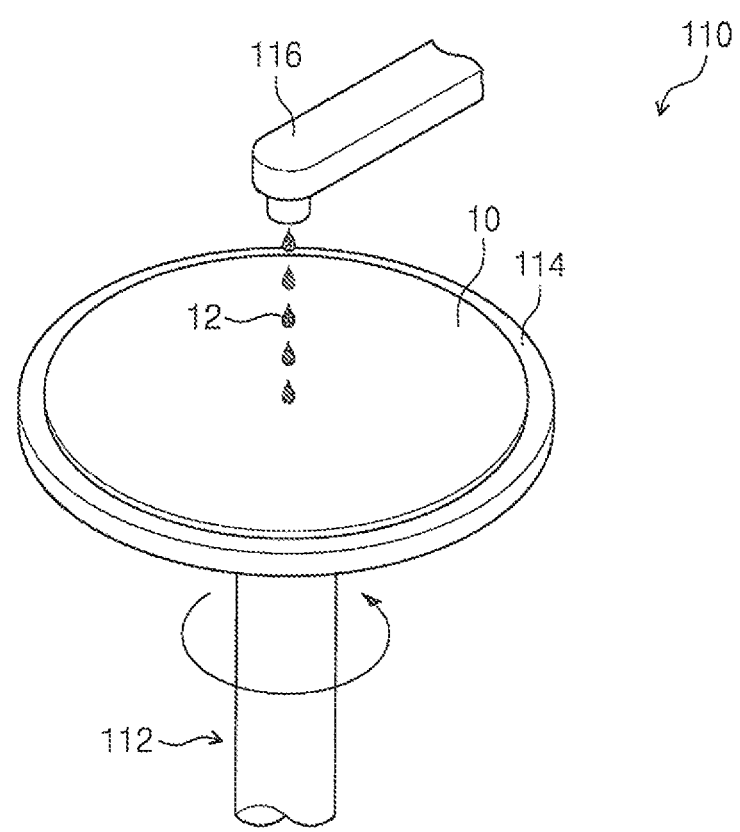
FIG. 2 is a perspective view of a spin coater of FIG. 1.

FIG. 2 illustrates the spin coater 110 of FIG. 1. The spin coater 110 may include a shaft 112, a disc 114, and a nozzle 116. The disc 114 may be disposed on the shaft 112. A substrate 10 may be disposed on the disc 114. The substrate 10 may be adsorbed to the disc 114 by vacuum. The nozzle 116 may supply photoresist 12 on the substrate 10. The shaft 112 may rotate the disc 114 and the substrate 10. The photoresist 12 may be applied on an entire surface of the substrate 10.

Figure 3:
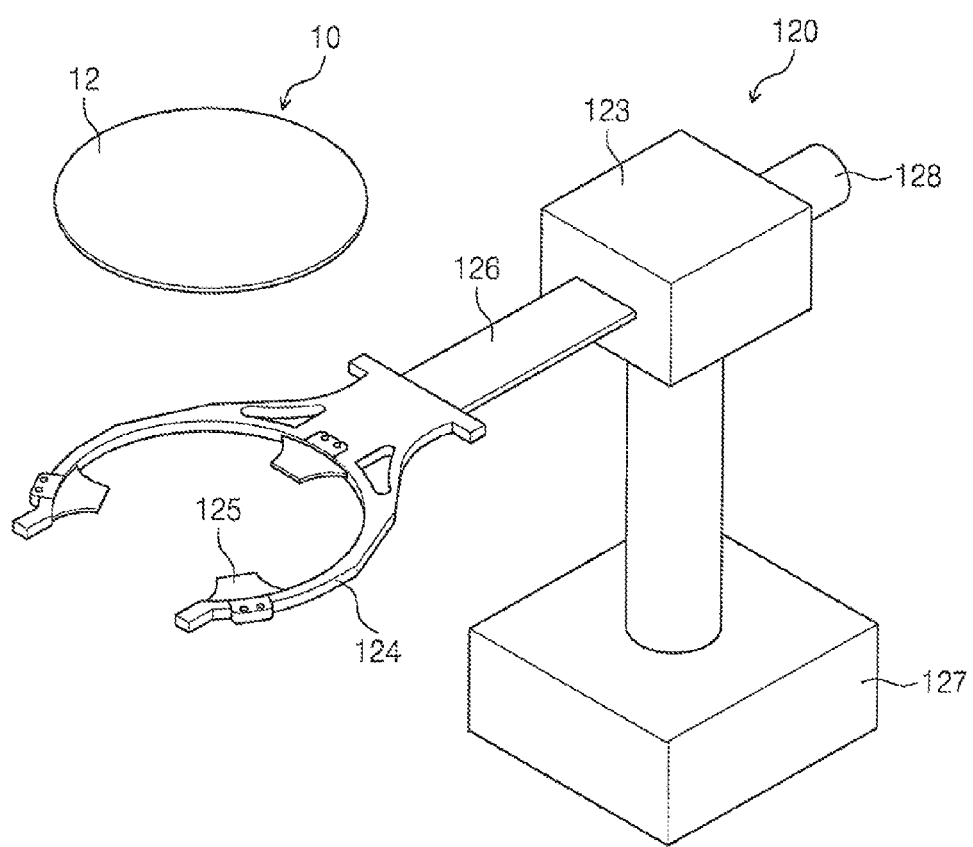
FIG. 3 is a perspective view of a substrate transfer unit of FIG. 1.

FIG. 3 illustrates the substrate transfer unit 120 of FIG. 1. The substrate transfer unit 120 may be a transfer robot. The substrate transfer unit 120 may include a first base 123, a first hand 124, a first arm 126, a first base driver 127, and a first arm driver 128. The first base 123 has a rectangular parallelepiped shape. The first arm 126 may extend forward from the first base 123, and the first hand 124 may be fixedly coupled to an end of the first arm 126. The first hand 124 may support a bottom surface of the substrate 10. The first hand 124 may have an annular ring shape with a front side opened. A support body 125 supporting an edge of the bottom surface of the substrate 10 may be disposed on an inner side surface of the first hand 124. The first arm 126 may be horizontally stretched or contracted by the first arm driver 128. The first base 123 may be vertically transferred by the first base driver 127. The substrate 10 may be transferred to the baker 130, the exposure apparatus 200, and the developer 140 by the substrate transfer unit 120. The substrate transfer unit 120 is not limited in structure and shape of FIG. 3. The substrate transfer unit 120 may have various structures and shapes. For example, the substrate transfer unit 120 may be provided as a rail or conveyor, which linearly transfers the substrate 10.

Figure 4:
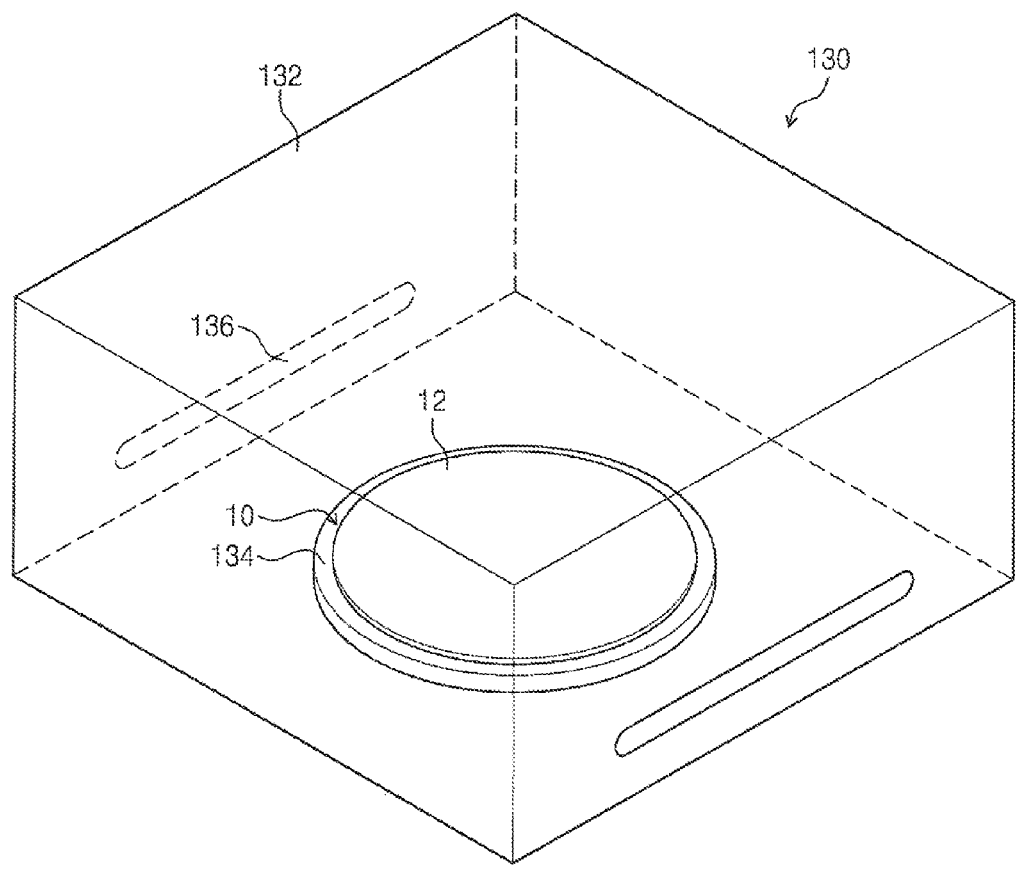
FIG. 4 is a perspective view of a baker.

FIG. 4 illustrates the baker 130. The baker 130 may cure the photoresist 12 on the substrate 10. The baker 130 may include a housing 132 and a hot plate 134 in the housing 132. The housing 132 may surround the hot plate 134. The housing 132 may have holes 136. The holes 136 may be formed in both side surfaces, facing each other, of the housing 132. The substrate transfer unit 120 may load the substrate 10 into the housing 132 through the holes 136. The hot plate 134 may heat the substrate 10. For example, the substrate 10 may be heated at a temperature of about 100° C. to about 300° C. A solvent (not shown) in the photoresist 12 may be evaporated. The photoresist 12 may be cured.

Figure 5:
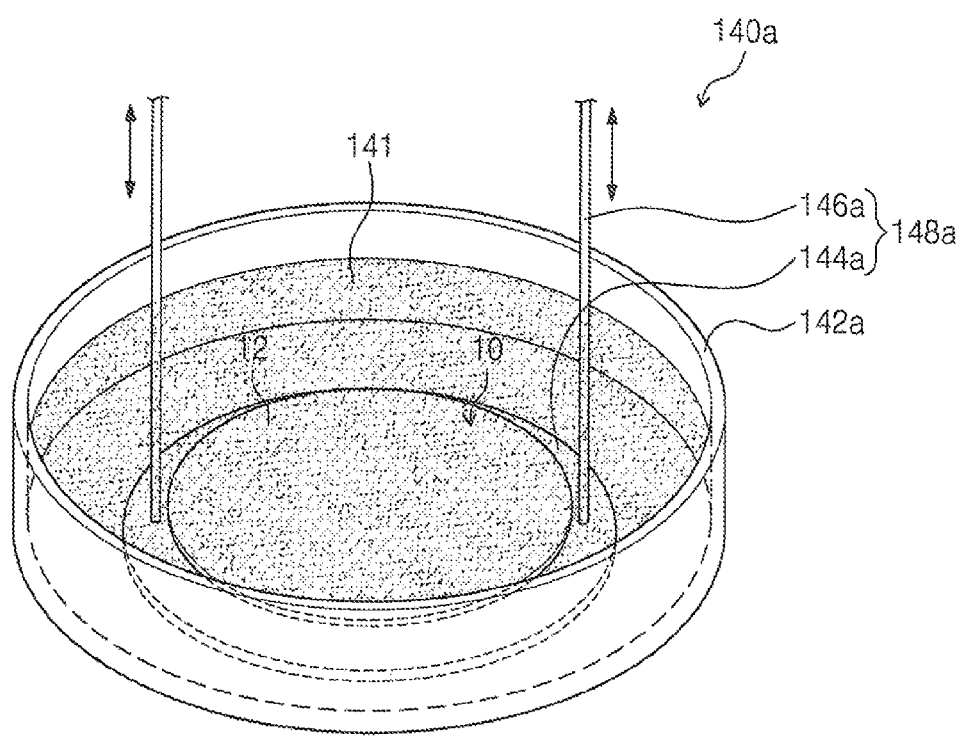
FIGS. 5 and 6 are perspective views of the developer of FIG. 1 according to embodiments.

FIG. 5 illustrates an example of the developer 140 of FIG. 1. The developer 140a may be a dip type developer. The dip type developer 140a may include a chemical solution bath 142a and a jig 148a. The chemical solution bath 142a may store a developing solution 141. The jig 148a may dip the substrate 10 into the developing solution 141. The jig 148a may include a plate 144a and lifters 146a. The plate 144a may support the substrate 10. The lifters 146a may be connected to both sides of the plate 144a. The lifters 146a may vertically move the plate 144a.

Figure 6:
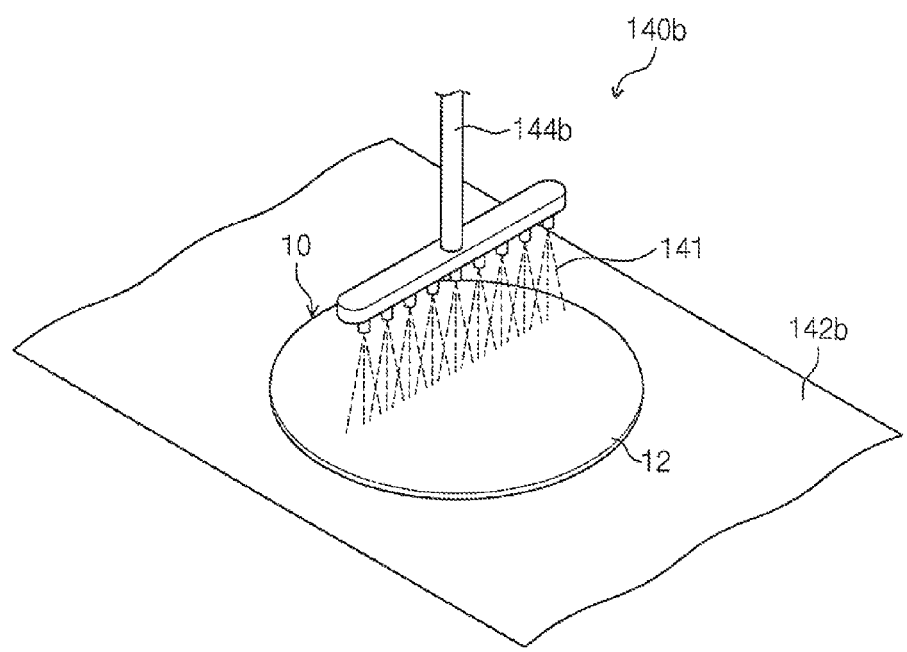

FIG. 6 illustrates another example of the developer 140 of FIG. 1. The developer may include an injection type developer 140b. The injection type developer 140b may include a chuck 142b and an injection nozzle 144b. The chuck 142b may fix the substrate 10. The injection nozzle 144b may discharge the developing solution 141 onto the entire surface of the substrate 10. The photoresist 12 on the substrate 10 may be developed by the developing solution 141.

Figure 7:
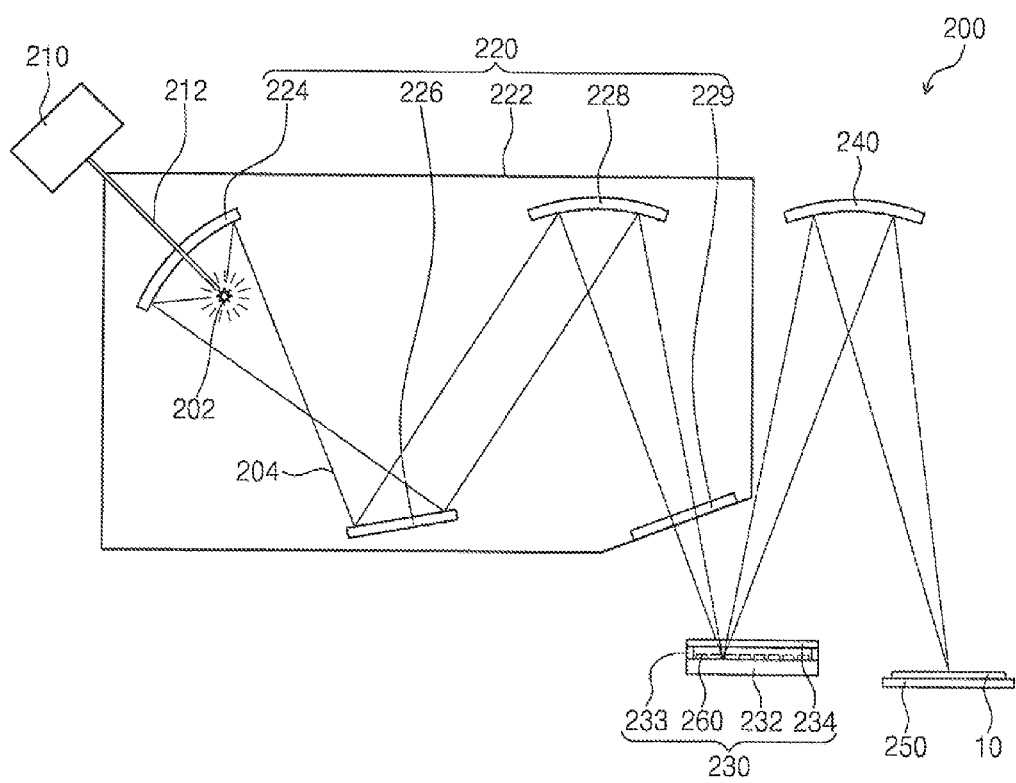
FIG. 7 is a view of the exposure apparatus in FIG. 1.

FIG. 7 illustrates an example of the exposure apparatus 200 of FIG. 1. The exposure apparatus 200 may include an EUV exposer. The exposure apparatus 200 may include an EUV source 202, a pumping light source 210, an illumination part 220, a mask 230, a projection part 240, and a stage 250.

The EUV source 202 may be provided in the illumination part 220. The EUV source 202 may be excited by a laser beam 212 to generate an EUV beam 204. According to an example, the EUV source 202 may include tin (Sn), xenon (Xe) gas, titanium (Ti), or lithium vapor, which is in a plasma state. The tin EUV source 202 may generate the EUV beam 204 having a wavelength of about 13.5 nm.

The pumping light source 210 may include a laser. The pumping light source 210 may supply the laser beam 212 to the illumination part 220. The laser beam 212 may be the pumping light supplied to the EUV source 202. The laser beam 212 may have a single wavelength of about 400 nm to about 800 nm.

The illumination part 220 may supply the EUV beam 204 to the mask 230. According to an example, the illumination part 220 may include a source housing 222, a collector mirror 224, a field facet mirror 226, a pupil facet mirror 228, and a source blocking part 229.

The source housing 222 may surround the collector mirror 224, the field facet mirror 226, the pupil facet mirror 228, and the source blocking part 229. The EUV source 202 may be filled in the source housing 222. For example, the EUV source 202 may be disposed between the collector mirror 224 and the source blocking part 229. The pumping light source 210 may supply the laser beam 212 inward from the outside of the source housing 222.

The collector mirror 224 may reflect the EUV beam 204 generated from the EUV source 202 to the field facet mirror 226. The EUV beam 204 may be focused onto the field facet mirror 226. The laser beam 212 may pass through a center of the collector mirror 224.

The field facet mirror 226 may reflect the EUV beam 204 to the pupil facet mirror 228. The EUV beam 204 between the field facet mirror 226 and the pupil facet mirror 228 may progress in parallel. The field facet mirror 226 may include a flat plate mirror.

The pupil facet mirror 228 may focus the EUV beam 204 onto the mask 230. The mask 230 may be disposed outside the source housing 222. The field facet mirror 228 may include a concave mirror.

The source blocking part 229 may be disposed in the source housing 222 between the pupil facet mirror 228 and the mask 230. The EUV beam 204 may pass through the source blocking part 229. The EUV beam 204 may progress outward from the inside of the source housing 222. The source blocking part 229 may block the EUV source 202. The EUV source 202 may flow along the EUV beam 204 from the collector mirror 224 to the source blocking part 229. The source blocking part 229 may include a membrane with a nanometer thickness. For example, the source blocking part 229 may include graphene. Nevertheless, the EUV source 202 may leak to the outside of the source housing 222. When the membrane is damaged, the EUV source 202 may pass through the source blocking part 229. Alternatively, the EUV source 202 may leak around the membrane.

The mask 230 may reflect the EUV beam 204 to the projection part 240. According to an example, the mask 230 may include a mask substrate 232, mask patterns 260, frames 233, and a pellicle 234. The mask substrate 232 may reflect the EUV beam 204. The mask substrate 232 may include glass. The mask patterns 260 may be disposed on the mask substrate 232. The mask patterns 260 may correspond to patterns to be transferred to the substrate 10. The mask patterns 260 may absorb the EUV beam 204. Alternatively, the mask substrate 232 may absorb the EUV beam 204, and the mask patterns 260 may reflect the EUV beam 204. The frames 233 may be disposed on an edge of the mask substrate 232 outside the mask patterns 260. The pellicle 234 may be disposed on the frames 233. The pellicle may cover the mask patterns 260 and the mask substrate 232.

The EUV beam 204 may pass through the pellicle 234. According to an example, the pellicle 234 may include carbon thin films with s nanometer thickness. The pellicle may protect a top surface of the mask substrate 232 and the mask patterns 260 against contaminants such as particles. Here, the contaminants may be generated on the pellicle 234. The contaminants may be mostly the EUV source 202. For example, each of the contaminants may have a diameter of about 0.1 μm to about 1 μm.

Figure 8:
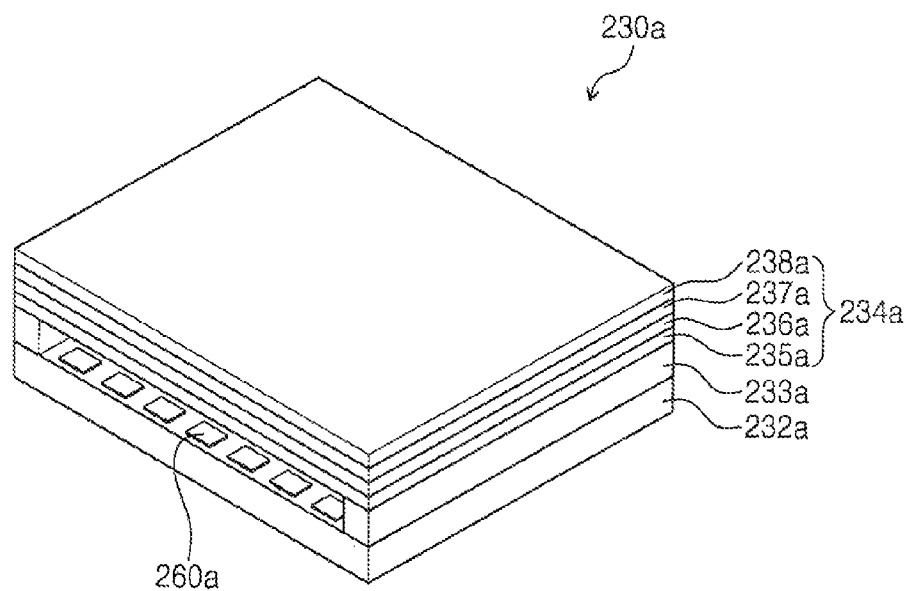
FIGS. 8 to 10 are perspective views of the mask of FIG. 7 according to embodiments.

FIG. 8 illustrates an example of the mask 230 of FIG. 7. According to an embodiment of the inventive concept, a pellicle 234a of a mask 230a may include first to fourth protection layers 235a to 238a. The first to fourth protection layers 235a to 238a may be spaced apart from the mask substrate 232a and the mask patterns 260a and stacked on the frame 233a. Each of the first to fourth protection layers 235a to 238a may include graphite. The graphite has a layered carbon bonding structure. The number of first to fourth protection layers 235a to 238a having the layered carbon bonding structure is not limited to FIG. 8. At least one protection layer may be further disposed on the fourth protection layer 238a. Alternatively, each of the first to fourth protection layers 235a to 238a may be provided as a single protection layer. The mask substrate 232a, the frames 233a, the mask patterns 260a, and the pellicle 234a in FIG. 8 are illustrated in a cut state.

Figure 9:
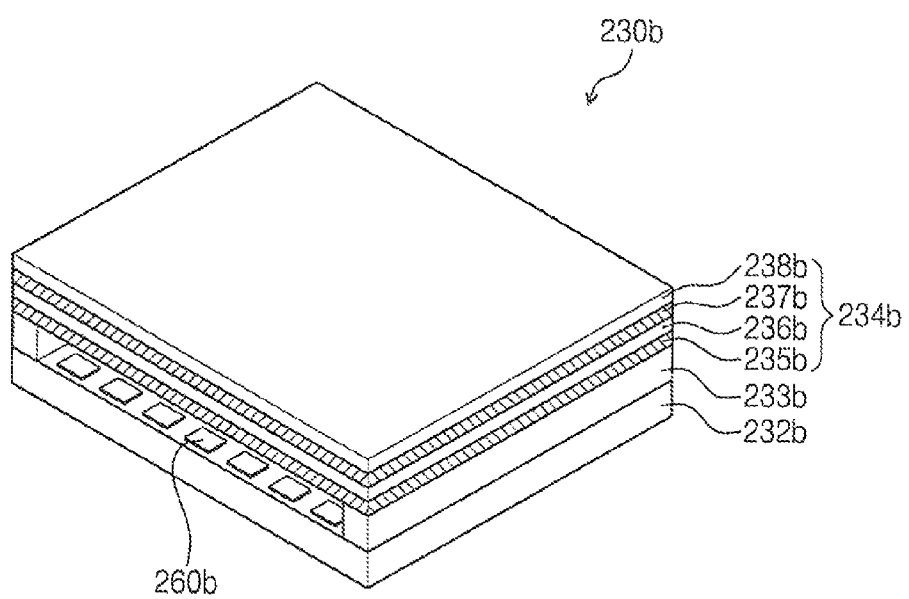

FIG. 9 illustrates another example of the mask 230 of FIG. 7. According to another embodiment of the inventive concept, a pellicle 234b of a mask 230b may include first and second support layers 235b and 237b and the first and second protection layers 236b and 238b. The first and second support layers 235b and 237b may support the first and second protection layers 236b and 238b, respectively. The first support layer 235b may be disposed on the frames 233. The first support layer 235b may be spaced apart from the mask patterns 260b and the mask substrate 232b. The first protection layer 236b may be disposed on the first support layer 235b. The second support layer 237b may be disposed on the first protection layer 236b. The second protection layer 238b may be disposed on the second support layer 237b. According to an example, the first and second layers 235b and 237b may include a carbon nanotube. Each of the first and second protection layers 236b and 238b may include graphite. Alternatively, the first and second layers 235b and 237b may include grapheme. The mask substrate 232b, the frames 233b, the mask patterns 260b, and the pellicle 234b in FIG. 9 are illustrated in a cut state.

Figure 10:
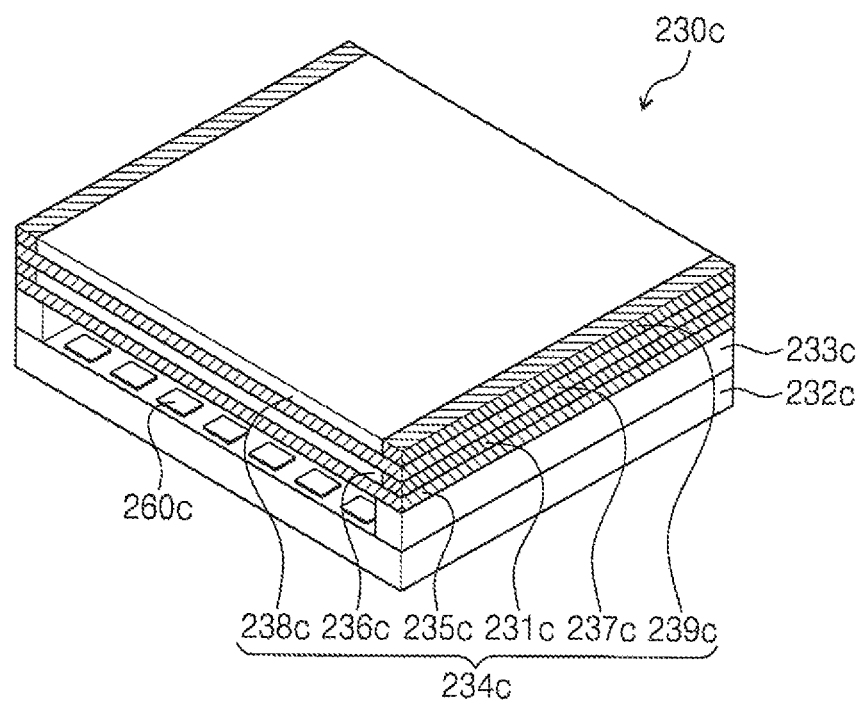

FIG. 10 illustrates another example of the mask 230 of FIG. 7. According to further another embodiment of the inventive concept, a pellicle 234c of a mask 230c may include first and second support layers 235c and 237c, first and second protection layers 236c and 238c, and first and second edge electrodes 231c and 239c. The first and second edge electrodes 231c and 239c may be disposed on the outside of the mask patterns 260. The first and second edge electrodes 231c and 239c may be disposed on the first and second support layers 235c and 237c, respectively. The first edge electrodes 231c and the first protection layer 236c may be disposed on the first support layer 235c. The first edge electrodes 231c may be disposed both facing edge sides of the first protection layer 236c, respectively. The first edge electrodes 231c may be connected to the first protection layer 236c and the first support layer 235c. The first edge electrodes 231c may extend along the frames 233c. The first edge electrodes 231c may be disposed on an edge of the mask substrate 232c. The second support layer 237c may be disposed on the first edge electrodes 231c and the first protection layer 236c. The second edge electrodes 239c and the second protection layer 238c may be disposed on the second support layer 237c. The second edge electrodes 239c may be disposed on the second support layer 237c corresponding to the first edge electrodes 231c. The second edge electrodes 239c may be connected to the second protection layer 238c and the second support layer 237c. Alternatively, the first and second edge electrodes 231c and 239c may be disposed on the first and second protection layers 236c and 238c outside the first and second support layers 235c and 237c. The mask substrate 232c, the frames 233c, the mask patterns 260c, and the pellicle 234c in FIG. 10 are illustrated in a cut state.

Referring again to FIG. 7, the projection part 240 may supply the EUV beam 204 to the substrate 10. The EUV beam 204 may be supplied to the substrate 10 along the mask patterns 260. The projection part 240 may include a concave mirror. The stage 250 may horizontally move the substrate 10. The EUV beam 204 may be irradiated onto the substrate 10.

The pellicle 234 may be contaminated by the EUV source 202 as the exposure process of the substrate is continuously performed. When the pellicle 234 is contaminated, a defective substrate may occur. The pellicle 234 may be repaired by the pellicle repairing apparatus 400. Alternatively, the pellicle 234 may be periodically repaired depending on a cumulative operation time of the exposure apparatus 200. The mask 230 may be transferred to the pellicle repairing apparatus 400 by the mask transfer device 300.

Figure 11:
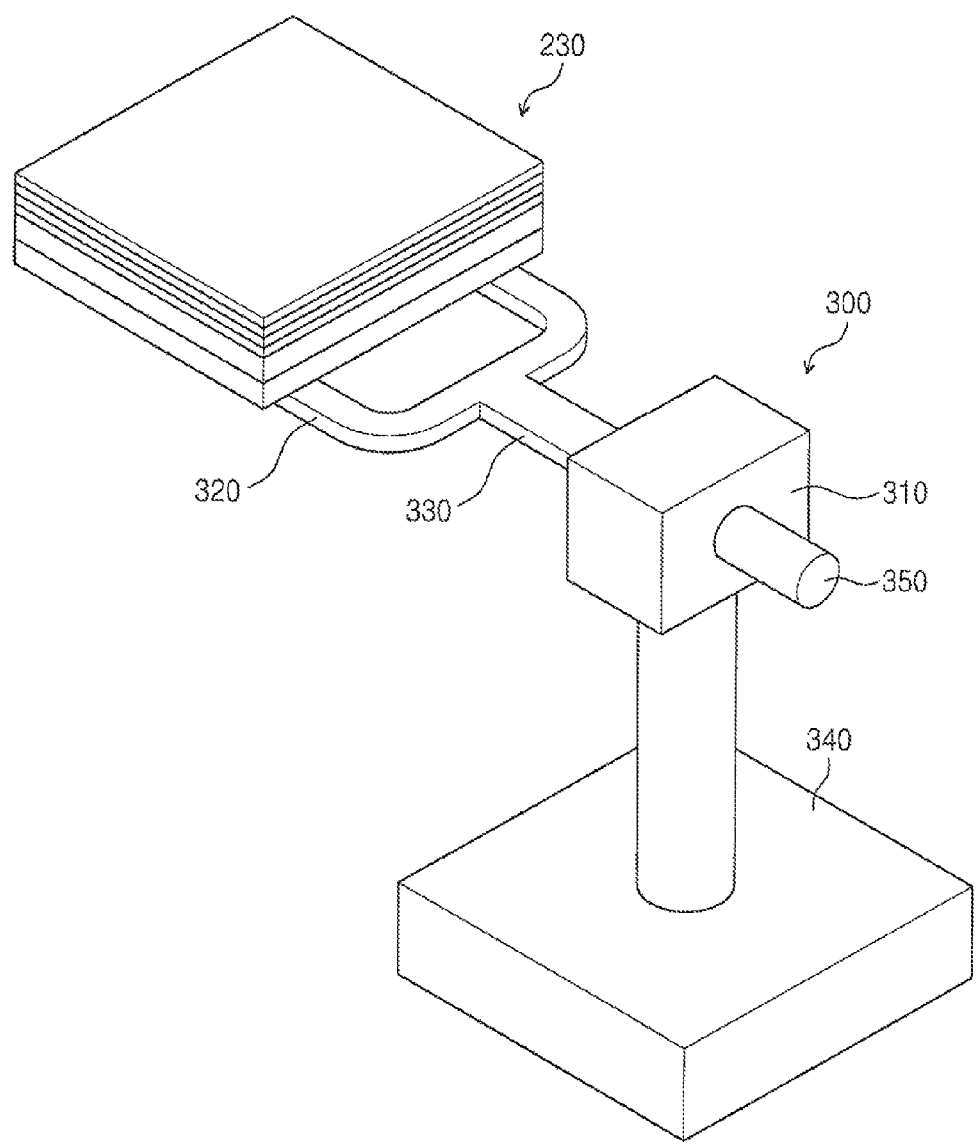
FIG. 11 is a perspective view of the mask transfer device of FIG. 1.

FIG. 11 illustrates the mask transfer device 300 of FIG. 1.

Referring to FIGS. 1 and 11, the mask transfer device 300 may include a second base 310, a second hand 320, a second arm 330, a second base driver 340, and a second arm driver 350. The second hand 320 may support a bottom surface of the mask 230. The second hand 320 may have a fork shape. The second arm 330 may be connected to the second hand 320. The second arm driver 350 may horizontally stretch or contract the second arm 330. The second base 310 may vertically move the second arm 330. The second base driver 340 may drive the second base 310. The mask 230 may be stably transferred by the mask transfer device 300.

Figure 12:
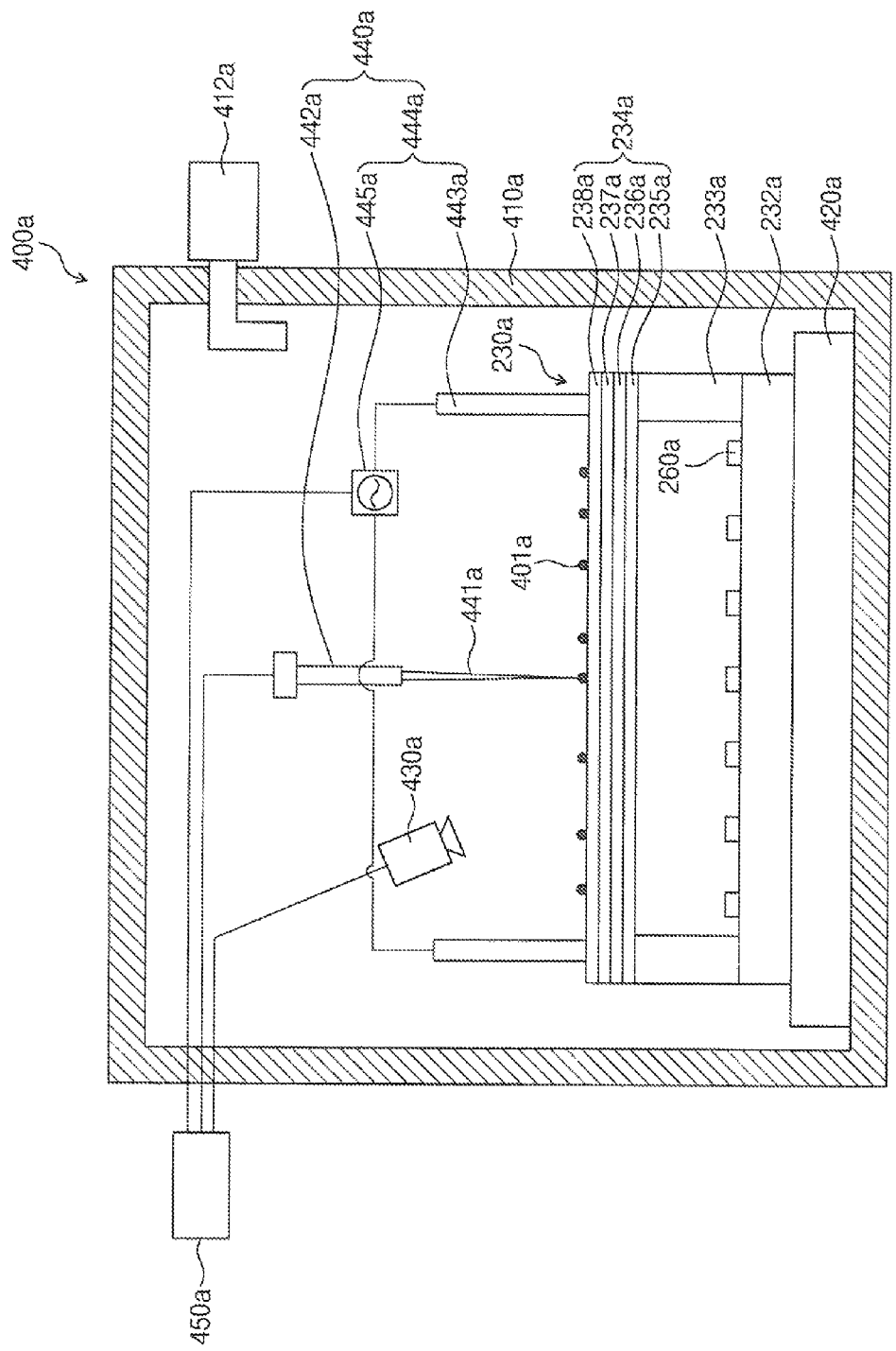
FIG. 12 is a view illustrating an example of the pellicle repairing apparatus of FIG. 1.

FIG. 12 illustrates an example of the pellicle repairing apparatus of FIG. 1.

Referring to FIGS. 7 and 12, a pellicle repairing apparatus 400a according to an embodiment of the inventive concept may include a chamber 410a, a vacuum pump 412a, a repairing stage 420a, a detector 430a, a decontamination part 440a, and a control part 450a.

The chamber 410a may provide an independent space for the mask 230a from the outside. The vacuum pump 412a may pump inner air in the chamber 410a. The chamber 410a may be in a vacuum state. The repairing stage 420a may be disposed on the bottom of the chamber 410a. The repairing stage 420a may support a bottom surface of the mask substrate 232a.

The detector 430a may be disposed above the mask 230a. The detector 430a may acquire a surface image of the pellicle 234a. According to an example, the detector 430a may acquire an image of a contaminant 401a having a size greater than a wavelength of the EUV beam 204. The contaminant may be the EUV source 202. The detector 430a may include a CCD/CMOS camera. The detector 430a may detect the contaminant 401a having a size greater than the wavelength of the EUV beam 204. For example, the detector 430a may detect the contaminant having a diameter of about 1 µm or more.

The control part 450a may grasp information with respect to the contaminants 401a on the pellicle 234a from the surface image. The control part 450a may determine numbers, location coordinates, and sizes of the contaminants 401a. The control part 450a may control a decontamination part 440a.

The decontamination part 440a may heat the contaminants 401a and the pellicle 234a. The decontamination part 440a may remove the contaminants 401a and the pellicle 234a. According to an example, the decontamination part 440a may include a point heating part 442a and a plane heating part 444a. The point heating part 442a may heat at least one of the contaminants 401a. For example, the point heating part 442a may include a laser. A laser pulse 441a may be individually provided to each of the contaminants 401a. Alternatively, the laser pulse 441a may be simultaneously provided to the plurality of contaminants 401a. The contaminants 401a may be crushed by the laser pulse 441a. Most of the crushed contaminant 401a may have sizes less than the wavelength of EUV beam 204. The contaminants 401a having the sizes less than the wavelength of the EUV beam 204 may not affect the EUV beam 204 anymore. That is, the EUV beam 201 may pass through the contaminants 401a having the sizes less than the wavelength thereof without interference. Alternatively, the contaminants 401a may be fused or evaporated by the laser pulse 441a. The fused contaminants 401 may be discharged to the outside of the chamber 410a through the vacuum pump 412a. The tin (Sn) contaminant 401a that is the EUV source may be crushed or fused at a temperature of about 231.93° C. On the other hand, the first to fourth protection layers 235a to 238a each of which is formed of graphite may not be damaged at a temperature from about 500° C. to about 700° C. The mask patterns 260a and the mask substrate 232a may be protected against the laser pulse 441a by the first to fourth protection layers 235a to 238a.

The plane heating part 444a may heat the pellicle 234a by Joule-heating. The plane heating part 444a may remove the contaminants 401 that are not removed by the point heating part 442a in a lump. The plane heating part 444a may fuse one of the first to fourth protection layers 235a to 238a and the contaminants 401. According to an example, the plane heating part 444a may include a plurality of fusing electrodes 443a and a power source 445a. The fusing electrodes 443a may be connected to both edges of the fourth protection layer 238a. The fusing electrodes 443a may be disposed on the frame 233a. The power source 445a may supply an electric power to the pellicle 234a through the fusing electrodes 443a. The pellicle 234a formed of graphite may be heated by Joule-heating. High temperature Joule-heating may break a binding loop between carbons. The first to fourth protection layers 235a to 238a may be burned layer by layer when energy of about 107 A/cm2 is applied. The fourth protection layer 238a that is the uppermost layer of the pellicle 234a may be burned. A carbon gas generated from the burned fourth protection layer 238a may be discharged outside the chamber 410a through the vacuum pump 412a. Alternatively, the fourth protection layer 238a and the contaminants 401 may be crushed to have diameters less than the wavelength of the EUV beam 204.

Although not shown, when the fourth protection layer 238a is removed, the third protection layer 237a may exist without the contaminants 401a. When the contaminants 401a are generated on the third protection layer 237a during the exposure process, the pellicle 234a may be repaired by the pellicle repairing apparatus 400. The contaminants 401a may be removed by the point heating part 442a. The third protection layer 237a may be burned by the plane heating part 444a. Then, the second protection layer 236a may be exposed. When the contaminants 401a are generated on the second protection layer 236a and the first protection layer 235a, the decontamination part 440a may remove the contaminants 401a. The second protection layer 236a and the first protection layer 235a may be burned. Top surfaces of the frames 233a, the mask patterns 260a, and the mask substrate 232a may be exposed to the outside. Then, the first to fourth protection layers 235a to 238a may be reformed on the frames 233a.

Figure 13:
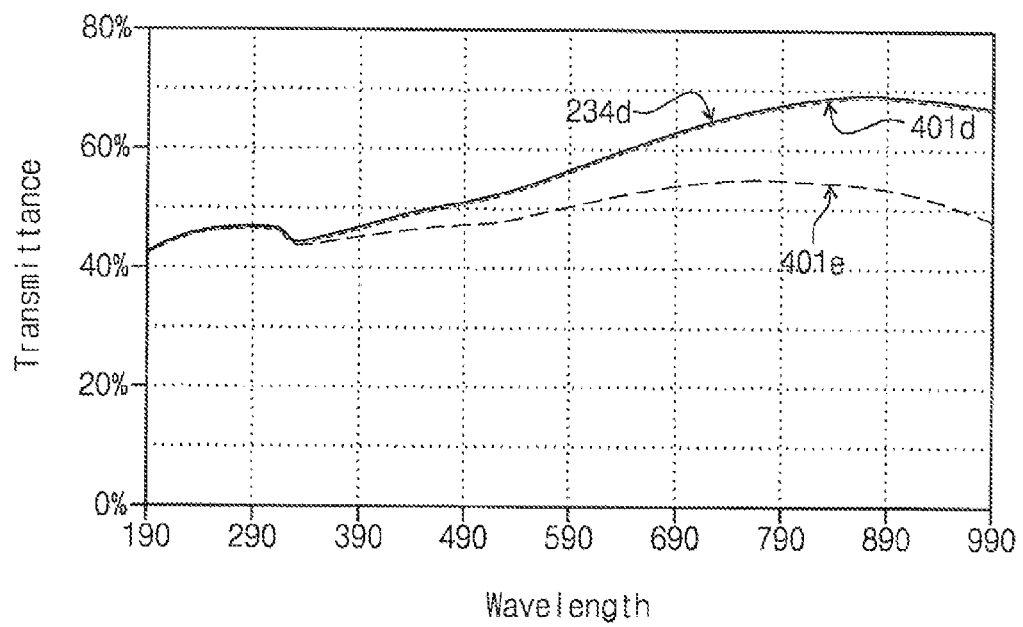
FIG. 13 is a graph illustrating transmittances of a pellicle and contaminants according to a wavelength of the laser pulse of FIG. 12.

FIG. 13 illustrates transmittances of the pellicle 234a and the contaminants 401a according to the wavelength of the laser pulse 441a of FIG. 12. In FIG. 13, a horizontal axis represents a wavelength of the laser pulse 441a, and a vertical axis represents a transmittance of the laser pulse 441a.

Referring to FIGS. 12 and 13, a transmittance 234d of the pellicle 234a is above about 50% to the laser pulse 441a having a wavelength of about 590 nm to about 990 nm. A difference 401d between transmittances of the titanium contaminants 401a and the pellicle 234a is above about 50% to the laser pulse 441a having a wavelength of about 550 nm to about 990 nm. Most of the energy of the laser pulse 441a may be absorbed by the titanium contaminants 401a. A transmittance (the transmittance 234d of the pellicle 234a—a difference 401e between transmittances of pellicles 234a and tin contaminants 401a) of titanium having a size of 1 um to the laser pulse 441a having a wavelength of about 890 nm may be nearly equal to 0. An absorptance may be almost 100%. The transmittance of titanium is obtained by subtracting a difference 401d between transmittances of pellicles 234a and titanium contaminants 401a from the transmittance 234d of the pellicle 234. The titanium contaminants 401a may well absorb the laser pulse 441a having a wavelength of 890 nm and thus be easily removed.

A difference 401e between transmittances of the tin contaminants 401a and the pellicle 234a is above about 50% in a range of wavelength of about 590 nm to about 940 nm. The difference 401e between transmittances of tin contaminants 401a and the pellicle 234a in a wavelength of about 790 nm is about 55%. The transmittance of the tin contaminants 401a is a transmittance to the tin contaminants 401 on the pellicle 234a. A transmittance (the transmittance 234d of the pellicle 234a—a difference 401e between transmittances of pellicles 234a and tin contaminants 401a) of tin contaminants 401a having diameters of about 1 um to the laser pulse 441a having a wavelength of about 790 nm is about 12%. The tin contaminants 401a may have an absorptance of about 88%. The transmittance of the tin contaminants 401a may be less by about 67% than the transmittance 234d of the pellicle 234a. Substantially, the transmittance 401e of the tin contaminants 401a may correspond to the sum of the transmittance 234d of the pellicle 234a and the absorptance of the tin contaminants 401a. That is, the tin contaminants 401a may have an absorptance of about 88% to the laser pulse 441a having the wavelength of about 790 nm and have an absorptance greater by about 67% than that of the pellicle. The tin contaminants 401a having a melting point of about 232 degrees may be heated faster than the pellicle 234a therearound, unlike the titanium contaminants having a melting point of about 1668 degrees. The tin contaminants 401a may be crushed without damaging the pellicle 234a. Each of the crushed tin contaminants 401a may have a size less than the wavelength of the EUV beam. The pellicle 234a may have a thickness of about 15 nm. Each of the tin contaminants 401a may have a diameter of about 1 um.

Figure 14:
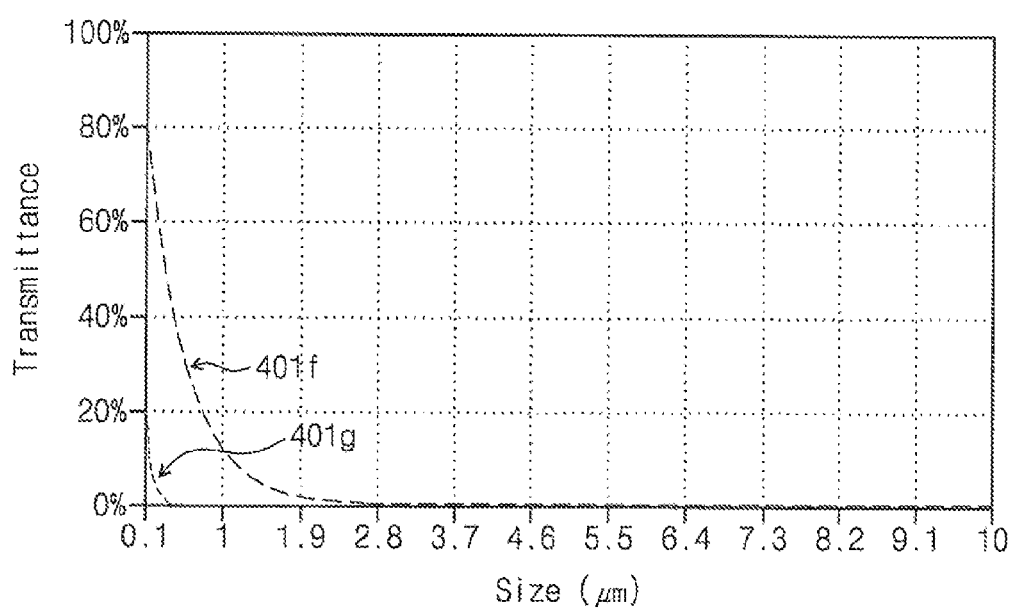
FIG. 14 is a graph illustrating transmittances of laser pulses according to diameters of the contaminants of FIG. 12.

FIG. 14 illustrates a transmittance [absorptance=1−transmittance] of the laser pulse 441a having a wavelength of about 800 nm to a diameter of the contaminant 401a of FIG. 12. In FIG. 14, a horizontal axis represents a diameter of the contaminant 401a, and a vertical axis represents a transmittance [absorptance=1−transmittance] of the laser pulse 441a.

Referring to FIGS. 12 and 14, the transmittance of the contaminants 401a to the laser pulse 441a may decrease as the contaminants 401a increases in diameter. The transmittance equals to 1 minus the absorptance. Accordingly, the absorptance may increase. The laser pulse 441a may have a wavelength of about 790 nm to about 800 nm. For example, a transmittance 401f of the tin contaminants 401a may gradually decrease from about 80% to about 10% as the diameter of the tin contaminant 401a increases from 0.1 um to about 1 um. The absorptance may gradually increase from about 20% to about 90%. The tin contaminant 401a having a diameter of about 1 um may have the absorptance of about 90% to the laser pulse 441a.

A transmittance 401g of the titanium contaminants 401a may decrease from about 20% to about 0% as the diameter of the titanium contaminant 401a increases from 0.1 um to about 0.3 um. The absorptance may gradually increase from about 80% to about 100%. The absorptance of the titanium contaminant 401a having a diameter of about 1 um is 100%. The titanium contaminant 401a having the diameter of about 1 um may absorb most of the laser pulse 441a. Accordingly, the laser pulse 441a may efficiently remove the tin contaminants 401a and titanium contaminants 401a.

Figure 15:
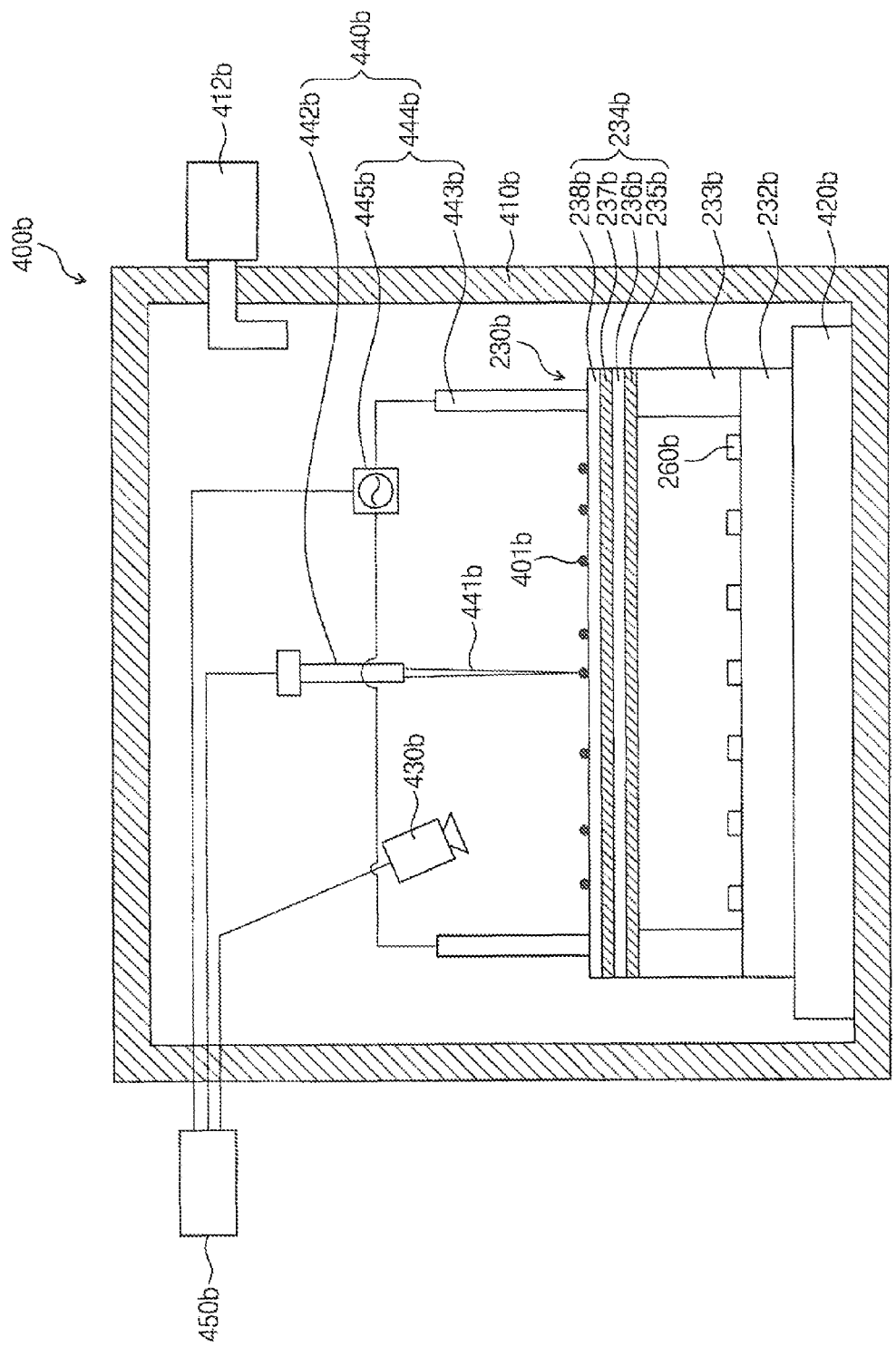
FIGS. 15 and 16 are views illustrating other examples of the pellicle repairing apparatus of FIG. 1.

FIG. 15 illustrates another example of the pellicle repairing apparatus 400 of FIG. 1.

Referring to FIGS. 7 and 15, a point heating part 442b may remove contaminants 401b by using a laser pulse 441b. A plane heating part 444b may fuse a second protection layer 238b. Fusing electrodes 443b may be connected to the second protection layer 238b. A power source 445b may supply an electric power to a pellicle 234b. The second protection layer 236b may be heated by Joule-heating.

Although not shown, a second support layer 237b may be exposed after the second protection layer 238b is fused. When the contaminants 401b are generated on the second support layer 237b, the fusing electrodes 443b may be connected to the second support layer 237b. The second support layer 237b and the contaminants 401b may be fused. After the second support layer 237b is fused, a first protection layer 236b may be exposed. When the contaminants 401b are generated on the first protection layer 236b, the fusing electrodes 443b may be connected to the first protection layer 236b. The first protection layer 236b may be fused. Then, the first support layer 235b may be exposed. When the contaminants 401b are generated on the first support layer 235b, the fusing electrodes 443b may be connected to the first support layer 235b. Then, the first support layer 235b may be fused. When the first support layer 235b is removed, frames 233b of a mask 230b, mask patterns 260b and the mask substrate 232b may be exposed. Then, the pellicle 234 may be reformed on the frames 233b.

A pellicle repairing apparatus 400b in FIG. 15 includes a chamber 410b, a vacuum pump 412b, a repairing stage 420b, a detector 430b, a decontamination part 440b, and a control part 450b, which have the same function as those of FIG. 12.

Figure 16:
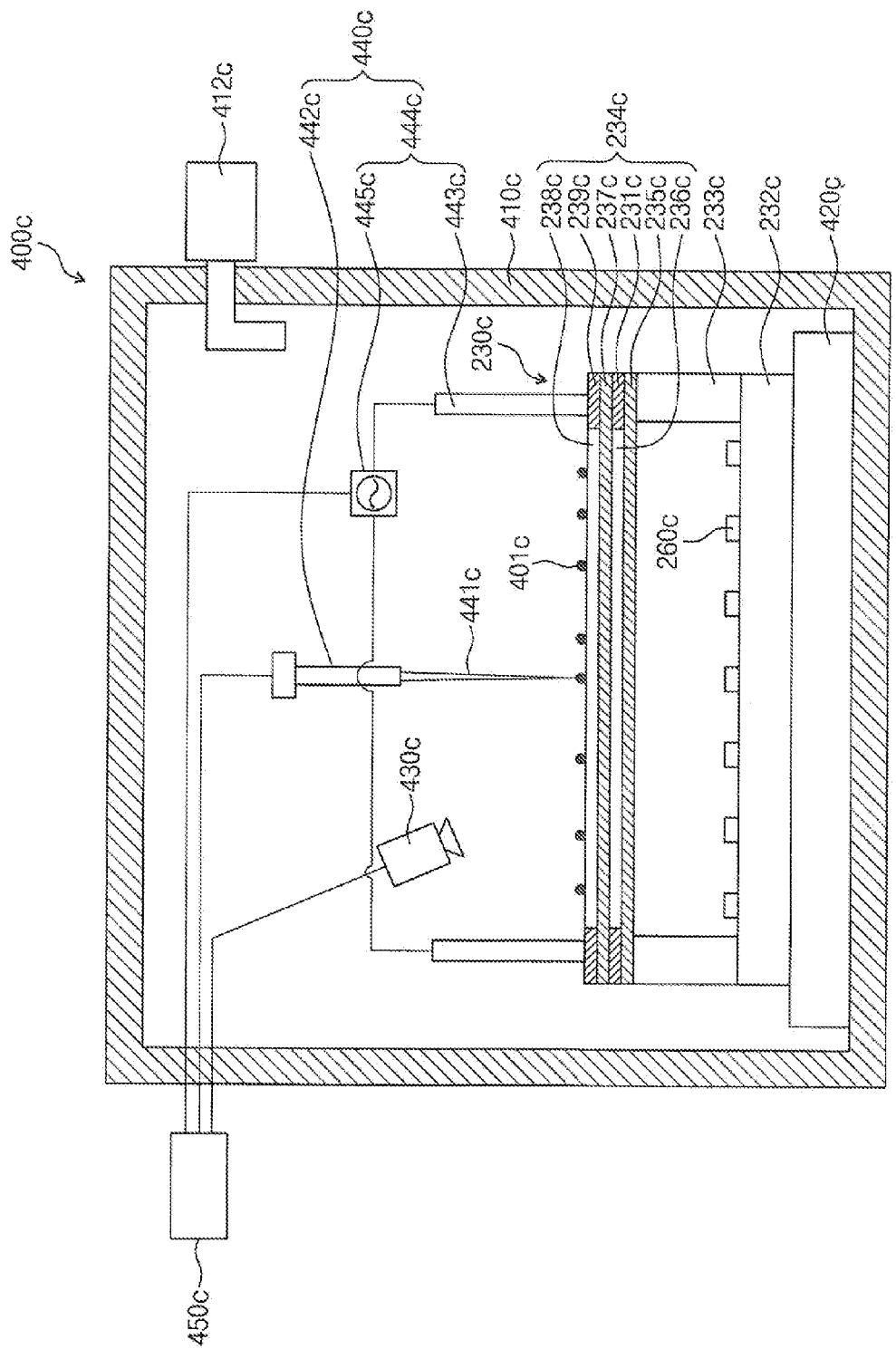

FIG. 16 illustrates another example of the pellicle repairing apparatus 400 of FIG. 1.

Referring to FIGS. 7 and 16, fusing electrodes 443c may be connected to second edge electrodes 239c. A detector 430c may monitor the fusing electrodes 443c and the second edge electrodes 239c. A control part 450c may determine whether the fusing electrodes 443c and the second edge electrodes 239c are connected and/or arranged. The fusing electrodes 443c may transfer an electric power of the power source 445c to the second edge electrodes 239c. The second edge electrodes 239c may be connected to both side surfaces of the second protection layer 238c. The second edge electrodes 239c may transmit the electric power to both side surfaces of the second protection layer 238c. The second protection layer 238c may be heated by Joule-heating. The second protection layer 238c and the contaminants 401c may be fused. Alternatively, the contaminants 401c may be crushed by a laser pulse 441c.

Although not shown, a second support layer 237c may be exposed to the outside when the second protection layer 238c is removed. When the contaminants 401c are generated on the second support layer 237c during an exposure process, the fusing electrodes 443c may supply an electric power to the second support layer 237c through the second edge electrodes 239c. The second support layer 237c may be fused by Joule-heating. The second edge electrodes 239c may be removed simultaneously together with the second support layer 238c. Alternatively, the second edge electrodes 239c may exist on the first edge electrode. Then, a first protection layer 236c and a first edge electrode 231c may be exposed to the outside. When the contaminants 401c are generated on the first protection layer 236c, the fusing electrodes 443c may be connected to the first edge electrodes 231c. The first protection layer 236c may be fused by Joule-heating. Then, the first support layer 235c may be exposed to the outside. When the contaminants 401c are generated on the first support layer 235c, the fusing electrodes 443c may be connected to the first edge electrodes 231c. The first support layer 235c may be fused by Joule-heating. Frames 233c of the mask 230c, mask patterns 260c, and a mask substrate 232 may be exposed to the outside. Then, the pellicle 234c may be reformed on the frames 233c.

A pellicle repairing apparatus 400c in FIG. 16 includes a chamber 410c, a vacuum pump 412c, a repairing stage 420c, a detector 430c, a point heating part 442c of a decontamination part 440c, a plane heating part 444c, and a control part 450c, which have the same function as those of FIG. 12.

As described above, the mask according to the embodiments of the inventive concept may include the pellicle including the protection layers having the nanometer thickness. Also, the pellicle repairing apparatus may include the point heating part and the plane heating part. The point heating part may crush the contaminants on the protection layers of the pellicle into the particles each of which has a size that is not transferred by the EUV exposure. The plane heating part may fuse the uppermost layer of the protection layers on which the contaminants are generated. The pellicle repairing apparatus may efficiently repair the polluted pellicle.

The description of the present invention is intended to be illustrative, and those with ordinary skill in the technical field of the present invention will be understood that the present invention can be carried out in other specific forms without changing the technical idea or essential features. Therefore, the embodiments described above include exemplary in all respects and not restrictive, but it should be understood.

What is claimed is:

1. A pellicle repairing apparatus, comprising:
   a chamber;
   a stage disposed in the chamber, the stage configured to support a photo-mask provided with a pellicle comprising a plurality of protection layers, each of which has a nanometer thickness;
   a detector configured to detect a contaminant on the pellicle; and
   a decontamination part configured to remove the contaminant and/or at least one of the plurality of protection layers, wherein the decontamination part comprises:
      a point heating part configured to crush the contaminant; and
      a plane heating part configured to remove an uppermost one of the plurality of protection layers.

2. The pellicle repairing apparatus of claim 1, wherein the point heating part comprises a laser configured to provide a laser pulse to the contaminant.

3. The pellicle repairing apparatus of claim 2, wherein the contaminant comprises tin having a diameter of about 1 um, and
   wherein the laser pulse has a wavelength of about 790 nm to about 800 nm.

4. The pellicle repairing apparatus of claim 1, wherein the plane heating part comprises:
   a plurality of fusing electrodes disposed on both edges of the uppermost one of the plurality of protection layers; and
   a power source configured to supply electric power to the plurality of fusing electrodes.

5. The pellicle repairing apparatus of claim 4, wherein the pellicle further comprises:
   a plurality of support layers supporting the plurality of protection layers, wherein the plurality of support layers are alternately disposed with the plurality of protection layers; and
   a plurality of edge electrodes disposed on both facing edge sides of each of the plurality of protection layers and on edges of each of the plurality of support layers, wherein the fusing electrodes are connected to the edge electrodes.

6. Substrate manufacturing equipment, comprising:
   a spinner apparatus configured to apply and develop a photoresist on a substrate;
   an exposure apparatus configured to transfer a mask pattern of a mask onto the photoresist; and
   a pellicle repairing apparatus configured to repair a pellicle of the mask, wherein the pellicle repairing apparatus comprises:
      a chamber;
      a stage disposed in the chamber, wherein the stage is configured to support the mask provided with the pellicle, the pellicle comprising a plurality of protection layers;
      a detector configured to detect a contaminant on the pellicle; and
      a decontamination part configured to remove the contaminant from the pellicle, wherein the decontamination part comprises:
         a point heating part configured to crush the contaminant; and
         a plane heating part configured to fuse an uppermost one of the plurality of protection layers.

7. The substrate manufacturing equipment of claim 6, wherein the decontamination part is configured to remove the contaminant and/or at least one of the plurality of protection layers.

8. The substrate manufacturing equipment of claim 6, wherein the point heating part comprises a laser configured to provide a laser pulse to the contaminant.

9. The substrate manufacturing equipment of claim 6, wherein the plane heating part comprises:

a plurality of fusing electrodes disposed on both edges of the uppermost one of the plurality of protection layers; and a power source configured to supply electric power to the fusing electrodes.

10. The substrate manufacturing equipment of claim 9, wherein the pellicle comprises:

a plurality of support layers supporting the plurality of protection layers, wherein the plurality of support layers are alternately disposed with the plurality of protection layers; and a plurality of edge electrodes disposed on facing edge sides of each of the plurality of protection layers and on edges of each of the plurality of support layers, and wherein the fusing electrodes are connected to the edge electrodes.

11. The substrate manufacturing equipment of claim 6, wherein the exposure apparatus comprises an EUV exposer configured to generate an EUV beam from an EUV source and to transfer the EUV beam onto the photoresist.

12. The substrate manufacturing equipment of claim 11, wherein the decontamination part comprises:

a point heating part that is configured to crush the contaminant into particles having a diameter less than a wavelength of the EUV beam; and a plane heating part that is configured to fuse an uppermost one of the plurality of protection layers.

13. A pellicle repairing apparatus, comprising:

a chamber;

a stage disposed in the chamber, the stage configured to support a photo-mask provided with a pellicle comprising a plurality of protection layers, each of which has a nanometer thickness;

a detector configured to detect a contaminant on the pellicle; and a decontamination part configured to remove the contaminant and/or at least one of the plurality of protection layers, wherein the decontamination part comprises:

a plurality of power electrodes connected on both edges of an uppermost one of the plurality of protection layers that provide electric power to the plurality of protection layers.

* * * * *